US011226556B2

(12) United States Patent
Godet et al.

(10) Patent No.: US 11,226,556 B2
(45) Date of Patent: Jan. 18, 2022

(54) PATTERNING OF MULTI-DEPTH OPTICAL DEVICES

(71) Applicant: Applied Materials, Inc., Santa Clara, CA (US)

(72) Inventors: Ludovic Godet, Sunnyvale, CA (US); Chien-An Chen, San Jose, CA (US); Brian Alexander Cohen, Delmar, NY (US); Wayne McMillan, San Jose, CA (US); Ian Matthew McMackin, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/844,636

(22) Filed: Apr. 9, 2020

(65) Prior Publication Data

US 2020/0326621 A1    Oct. 15, 2020

Related U.S. Application Data

(60) Provisional application No. 62/832,807, filed on Apr. 11, 2019.

(51) Int. Cl.
    *G03F 7/00*     (2006.01)
    *H01L 21/311*   (2006.01)
    *G02B 6/34*     (2006.01)

(52) U.S. Cl.
    CPC .......... *G03F 7/0005* (2013.01); *G02B 6/34* (2013.01)

(58) Field of Classification Search
    None
    See application file for complete search history.

(56) References Cited

U.S. PATENT DOCUMENTS

| 5,147,825 | A   |   | 9/1992  | Koch et al. |           |
|-----------|-----|---|---------|-------------|-----------|
| 5,288,659 | A   |   | 2/1994  | Koch et al. |           |
| 8,323,520 | B2  | * | 12/2012 | Hiraoka     | B32B 23/08 |
|           |     |   |         |             | 216/54    |
| 8,926,849 | B2  | * | 1/2015  | Chen        | G02B 5/1857 |
|           |     |   |         |             | 216/24    |

(Continued)

FOREIGN PATENT DOCUMENTS

EP    0356190 A2    2/1990

OTHER PUBLICATIONS

International Search Report and Written Opinion dated Jul. 30, 2020 for Application No. PCT/US2020/027370.

*Primary Examiner* — Shamim Ahmed
(74) *Attorney, Agent, or Firm* — Patterson + Sheridan, LLP

(57) ABSTRACT

Methods for patterning of multi-depth layers for the fabrication of optical devices are provided. In one embodiment, a method is provided that includes disposing a resist layer over a device layer disposed over a top surface of a substrate, the device layer having a first portion and a second portion, patterning the resist layer to form a first resist layer pattern having a plurality of first openings and a second resist layer pattern having a plurality of second openings, and etching exposed portions of the device layer defined by the plurality of first openings and the plurality of second openings, wherein the plurality of first openings are configured to form at least a portion of a plurality of first structures within the optical device, and the plurality of second openings are configured to form at least a portion of a plurality of second structures within the optical device.

16 Claims, 9 Drawing Sheets

(56) References Cited

U.S. PATENT DOCUMENTS

| | | |
|---|---|---|
| 10,775,158 B2 * | 9/2020 | Olson .................... G01B 11/22 |
| 10,935,799 B2 * | 3/2021 | Meyer Timmerman Thijssen ...... G02B 27/0944 |
| 2004/0037503 A1 | 2/2004 | Hastings et al. |
| 2005/0207013 A1 | 9/2005 | Kanno et al. |
| 2008/0304004 A1 | 12/2008 | Amako et al. |
| 2009/0087794 A1 | 4/2009 | Sekikawa et al. |
| 2019/0324202 A1 * | 10/2019 | Colburn ............. G02B 27/0172 |

* cited by examiner

PATTERNING OF MULTI-DEPTH OPTICAL DEVICES

CROSS-REFERENCE TO RELATED APPLICATIONS

This application claims priority to U.S. Provisional Patent Application Ser. No. 62/832,807, filed on Apr. 11, 2019, which herein is incorporated by reference.

BACKGROUND

Field

Embodiments of the present disclosure generally relate to optical devices. More specifically, embodiments described herein provide for patterning multi-depth layers for the fabrication of optical devices.

Description of the Related Art

Optical devices may be used to manipulate the propagation of light by spatially varying structural parameters (e.g., shape, size, orientation) of structures of the optical devices formed on a substrate. The optical devices provide a spatially varying optical response that molds optical wavefronts as desired. These structures of the optical devices alter light propagation by inducing localized phase discontinuities (i.e., abrupt changes of phase over a distance smaller than the wavelength of the light). These structures may be composed of different types of materials, shapes, or configurations on the substrate and may operate based upon different physical principles.

Fabricating optical devices requires forming structures from a device layer disposed on the substrate. However, the desired properties of an optical device to be fabricated may necessitate structures having various depths. Forming structures with various depths from may require patterning multiple layers disposed adjacently over the substrate. Accordingly, what is needed in the art are methods for patterning of multi-depth layers for the fabrication of optical devices.

SUMMARY

Methods for patterning of multi-depth layers for the fabrication of optical devices are provided. In one embodiment, a method is provided that includes disposing a resist layer over a device layer disposed over a top surface of a substrate, the device layer having a first portion having a first height from the top surface of the substrate and a second portion having a second height from the top surface of the substrate, patterning the resist layer to form a first resist layer pattern having a plurality of first openings formed therein over the first portion of the device layer and form a second resist layer pattern having a plurality of second openings formed therein over the second portion of the device layer, and etching exposed portions of the device layer defined by the plurality of first openings and the plurality of second openings, wherein the plurality of first openings in the first resist layer pattern are configured to form at least a portion of a plurality of first structures within the optical device, and the first structures have a first depth relative to the top surface of the substrate, and the plurality of second openings in the second resist layer pattern are configured to form at least a portion of a plurality of second structures within the optical device, and the second structures have a second depth relative to the top surface of the substrate.

In another embodiment, a method is provided that includes disposing a hardmask over a device layer disposed over a top surface of a substrate, the device layer having a first portion having a first height from the top surface of the substrate and a second portion having a second height from the top surface of the substrate, disposing a resist layer over the hardmask, the resist layer having a top surface parallel to the top surface of the substrate, patterning the resist layer to form a first resist layer pattern having a plurality of first openings formed therein over the first portion of the device layer and form a second resist layer pattern having a plurality of second openings formed therein over the second portion of the device layer, etching exposed portions of the hardmask defined by the plurality of first openings and the plurality of second openings to expose unmasked first device layer segments of the first portion of the device layer and expose unmasked second device layer segments of the second portion of the device layer, and etching the first device layer segments and the second device layer segments, wherein the first device layer segments are configured to form at least a portion of a plurality of first structures within the optical device, and the first structures have a first depth relative to the top surface of the substrate and the second device layer segments are configured to form at least a portion of a plurality of second structures within the optical device, and the second structures have a second depth relative to the top surface of the substrate.

In yet another embodiment, a method is provided that includes disposing a planarization layer over a device layer disposed over a top surface of a substrate, the device layer having a first portion having a first height from the top surface of the substrate and a second portion having a second height from the top surface of the substrate, disposing a resist layer over the planarization layer, patterning the resist layer to form a first resist layer pattern having a plurality of first openings formed therein over the first portion of the device layer and form a second resist layer pattern having a plurality of second openings formed therein over the second portion of the device layer, etching exposed portions of the planarization layer defined by the plurality of first openings and the plurality of second openings to expose unmasked first device layer segments of the first portion of the device layer and expose unmasked second device layer segments of the second portion of the device layer, and etching the first device layer segments and the second device layer segments, wherein the first device layer segments are configured to form at least a portion of a plurality of first structures within the optical device, and the first structures have a first depth relative to the top surface of the substrate, and the second device layer segments are configured to form at least a plurality of second structures within the optical device, and the second structures have a second depth relative to the top surface of the substrate.

BRIEF DESCRIPTION OF THE DRAWINGS

So that the manner in which the above recited structures of the present disclosure can be understood in detail, a more particular description of the disclosure, briefly summarized above, may be had by reference to embodiments, some of which are illustrated in the appended drawings. It is to be noted, however, that the appended drawings illustrate only

Figure 1A:
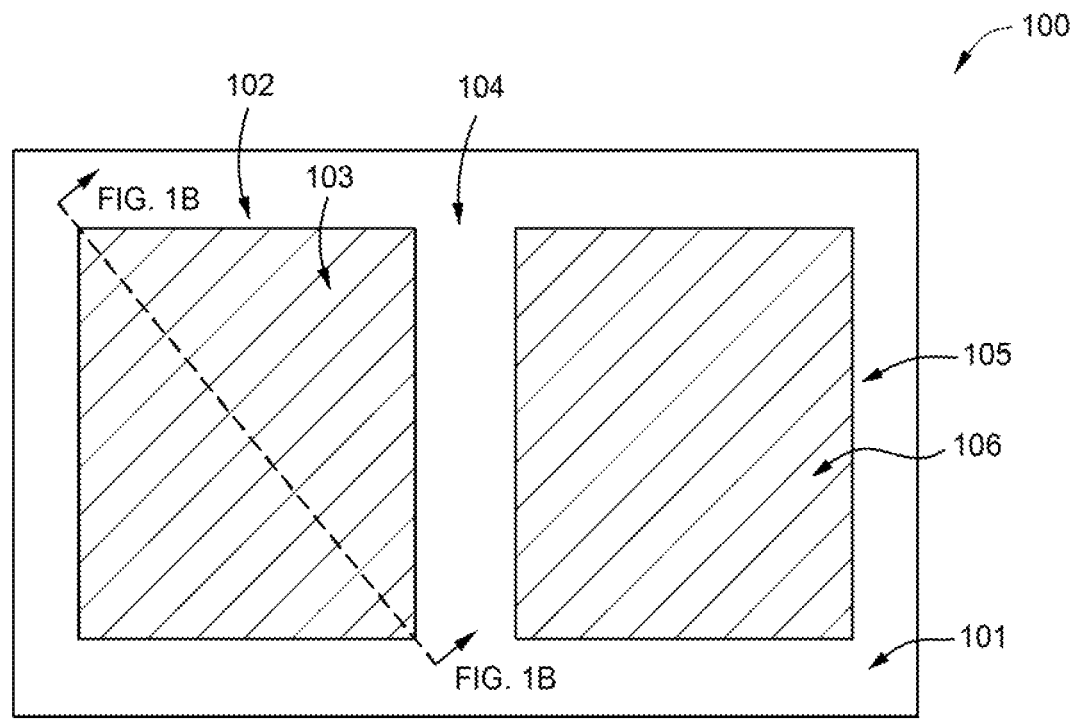
FIG. 1A is a schematic, perspective view of an optical device according to one embodiment.

To facilitate understanding, identical reference numerals have been used, where possible, to designate identical elements that are common to the figures. It is contemplated that elements and structures of one embodiment may be beneficially incorporated in other embodiments without further recitation.

DETAILED DESCRIPTION

Embodiments of the present disclosure relate to patterning multi-depth layers for the fabrication of optical devices.

FIG. 1A is a schematic, perspective view of an optical device 100. In one embodiment, the optical device 100 is a waveguide combiner, for example an augmented reality waveguide combiner. It is to be understood that the optical device 100 described below is an exemplary waveguide combiner. The optical device 100 includes a substrate 101, a first grating 102 defined by a plurality of structures 103, and a second grating 105 defined by a plurality of structures 106. In one embodiment, the structures 103 and the structures 106 are nanostructures having sub-micron critical dimensions, e.g., nano-sized critical dimensions.

Figure 1B:
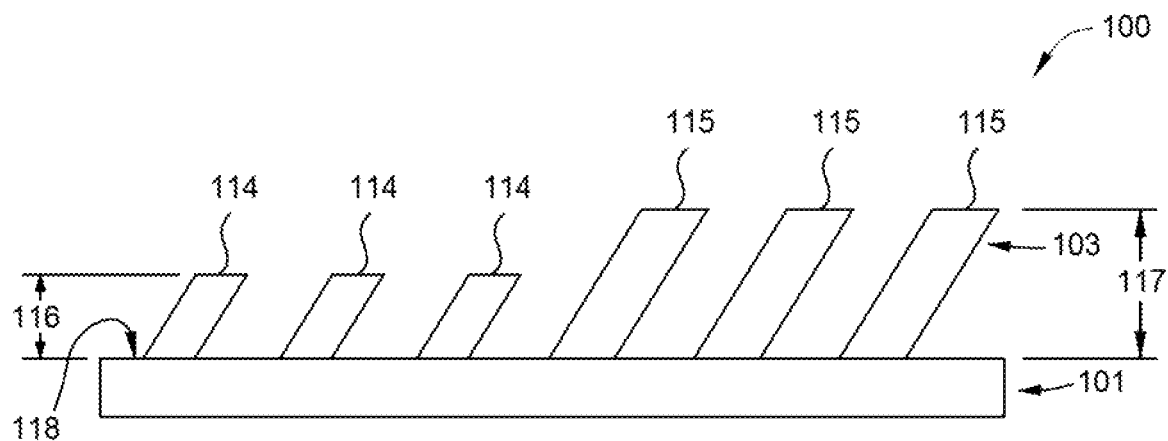
FIG. 1B is a schematic, cross-sectional view of the optical device of FIG. 1A.

FIG. 1B is a schematic, cross-sectional view of the optical device 100 according to FIG. 1A. The optical device 100 includes a plurality of structures 103 having two or more depths. As shown in FIG. 1B, a plurality of first structures 114 have a first depth 116 to a top surface 118 of the substrate 101, and a plurality of second structures 115 have a second depth 117 to the top surface 118 of the substrate 101. The first depth 116 and the second depth 117 are different. For example, as shown in FIG. 1B, the first depth 116 is less than the second depth 117. In one embodiment, the structures 103 are at an angle with regard to the top surface 118 of the substrate 101. In another embodiment, the structures 103 are perpendicular to the top surface 118 of the substrate 101.

Figure 2A:
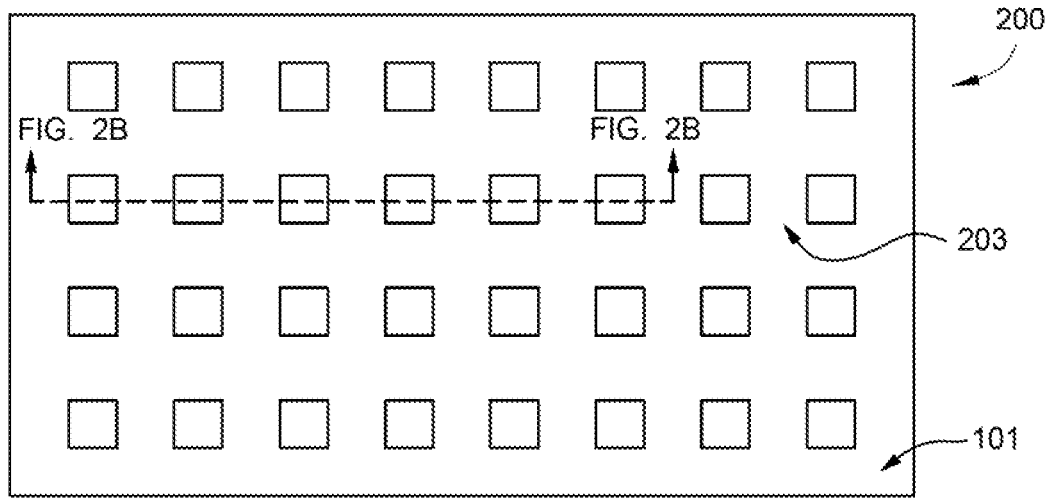
FIG. 2A is a schematic, perspective view of an optical device according to one embodiment.

FIG. 2A is a schematic, perspective view of an optical device 200 having one or more structures 203 according to embodiments described herein. In some embodiments, the optical device 200 is a flat optical device, such as a metasurface. The one or more structures 203 are disposed on the substrate 101. While FIG. 2A depicts the one or more structures 203 as having square or rectangular cross-sections, the cross-sections of the one or more structures 203 may have other shapes including, but not limited to, circular, triangular, and/or irregular shaped cross-sections. In one embodiment, the structures 203 are nanostructures having sub-micron critical dimensions, e.g., nano-sized critical dimensions.

Figure 2B:
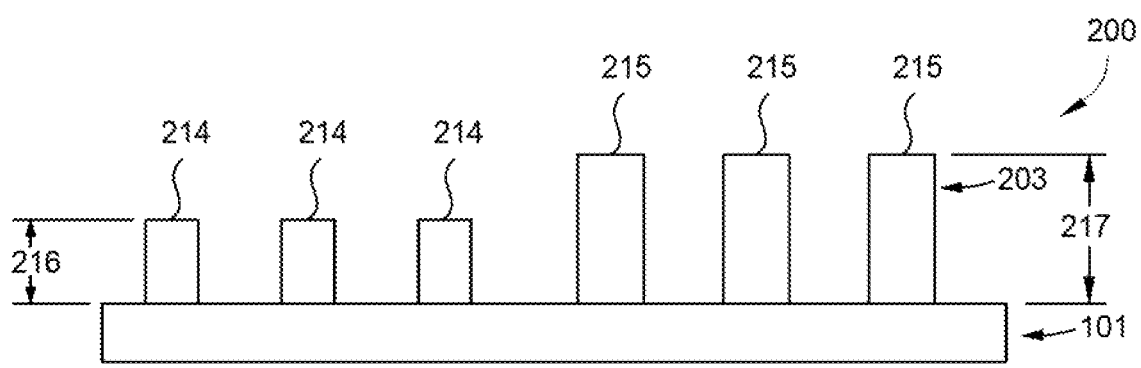
FIG. 2B is a schematic, cross-sectional view of the optical device of FIG. 2A.

FIG. 2B is a schematic, cross-sectional view of the optical device 200 according to FIG. 2A. The optical devices 200 includes one or more structures 203, such as one or more first structures 214 and one or more second structures 215 disposed on the substrate 101. The one or more first structures 214 have a first depth 216 to the top surface 118 of the substrate 101. The one or more second structures 215 have a second depth 217 to the top surface 188 of the substrate 101. The first depth 216 and the second depth 217 are different. For example, as shown in FIG. 2B, the first depth 216 is less than the second depth 217. In one embodiment, the structures 203 are at an angle with regard to the top surface 118 of the substrate 101. In another embodiment, the structures 203 are perpendicular to the top surface 118 of the substrate 101.

The substrate 101 may be selected to transmit a suitable amount of light of a desired wavelength or wavelength range, such as one or more wavelengths in the infrared region to UV region (i.e., from about 700 to about 1500 nanometers). Without limitation, in some embodiments, the substrate 101 is configured such that the substrate 101 transmits greater than or equal to about 50%, 60%, 70%, 80%, 90%, 95%, 99%, to UV region of the light spectrum. The substrate 101 may be formed from any suitable material, provided that the substrate 101 can adequately transmit light in a desired wavelength or wavelength range and can serve as an adequate support for the optical devices. In some embodiments, the material of substrate 101 has a refractive index that is relatively low, as compared to the refractive index of the device material. Substrate selection may include substrates of any suitable material, including, but not limited to, amorphous dielectrics, crystalline dielectrics, silicon oxide, polymers, and combinations thereof. In some embodiments, the substrate 101 includes a transparent material. In one embodiment, the substrate 101 is transparent with absorption coefficient smaller than 0.001. Suitable examples may include an oxide, sulfide, phosphide, telluride, or combinations thereof.

In some embodiments, the optical devices 100, 200 described herein include first structures 114, 214 having first depths 116, 216 and second structures 115, 215 having second depths 117, 217 disposed in the substrate 101. In the embodiments described herein of the methods 300, 500, and 700 for the forming optical devices 100, 200, the substrate 101 has a first height 404 and a second height 405 (shown in FIG. 4A). The first height 404 corresponds to the first depth 116, 216 of the first structures 114, 214 to be formed, and the second height 405 corresponding to the second depth 117, 217 of the plurality of second structures 115, 215 to be formed in the substrate 101.

In other embodiments, the optical devices 100, 200 described herein include first structures 114, 214 having first depths 116, 216 and second structures 115, 215 having second depths 117, 217 are disposed over the substrate 101. The first structures 114, 214 and the second structures 115, 215 are formed from a device layer 408. Prior to the methods 300, 500, and 700, the device layer 408 has a first height 411 and a second height 412. The first height 411 corresponds to the first depth 116, 216 of the first structures 114, 214 to be formed, and the second height 412 corresponds to the second depth 117, 217 of the plurality of second structures 115, 215 to be formed.

Figure 3:
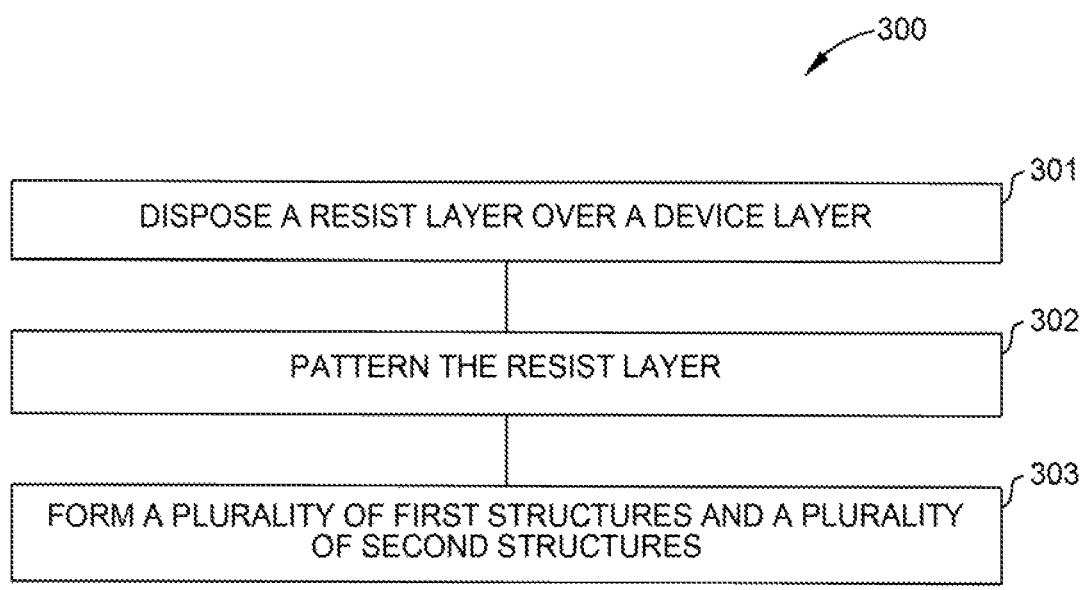
FIG. 3 is a flow diagram of a method for forming an optical device according to an embodiment.

FIG. 3 is a flow diagram of a method 300 for forming a portion of an optical device 100, 200 according to embodiments described herein. FIGS. 4A-4E are schematic, cross-sectional views of the substrate 101 during a method of forming a portion of an optical device 100 or an optical device 200 according to an embodiment. The portion may correspond to one grating, such as the first grating 102 or second grating 105, or the portion may correspond to the entirety of the optical device 100 or optical device 200.

Figure 4A:
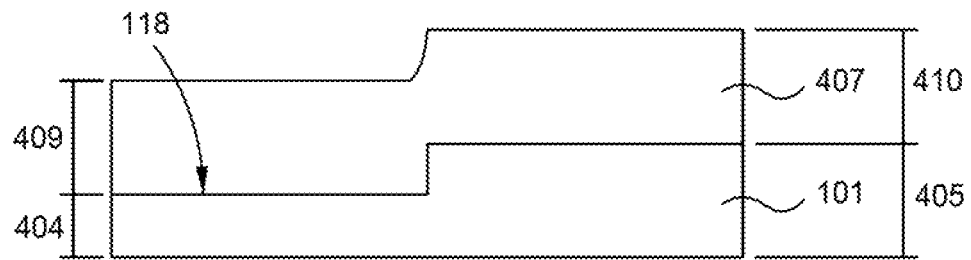
FIGS. 4A-4E are schematic, cross-sectional views of a substrate during a method of forming an optical device according to an embodiment.
Figure 4B:
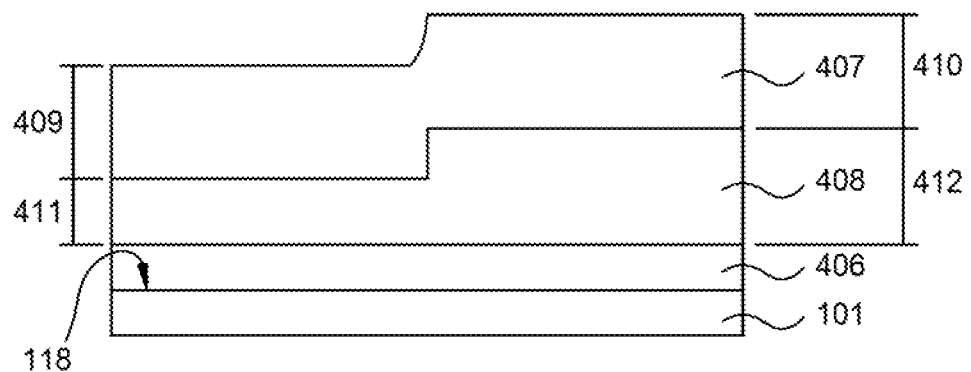

FIG. 4A illustrates an embodiment, in which a resist layer 407 is disposed on the substrate 101. In one embodiment, the substrate 101 is patterned, the substrate 101 having first height 404 and second height 405 for achieving first structures 114, 214 and second structures 115, 215 of various heights. FIG. 4B illustrates an embodiment in which the resist layer 407 is disposed on a device layer 408 and the device layer 408 is disposed on the top surface 118 of the substrate 101. In one embodiment, the device layer 408 is patterned, the device layer having first height 411 and second height 412 for achieving first structures 114, 214 and second structures 115, 215 of various heights.

In one embodiment, the resist layer 407 includes a silicon-containing material. In another embodiment, the resist layer 407 includes an organic material. The resist layer 407 is deposited on the substrate 101 through any suitable method, such as a liquid material pour casting process, a spin-on coating process, a liquid spray coating process, a dry powder coating process, a screen printing process, a doctor blading process, a physical vapor deposition (PVD) process, a chemical vapor deposition (CVD) process, a flowable CVD (FCVD) process, or an atomic layer deposition (ALD) process. The thickness of the resist layer 407 is selected in order to tune the etch process and the resulting critical dimensions of the plurality of structures 103. For example, a greater thickness of the resist layer 407 can result in smaller critical dimensions of the plurality of structures 103. In one embodiment, the thickness of the resist layer 407 ranges from about 50 nm to about 300 nm. In one embodiment, the resist layer 407 has a first thickness 409 and a second thickness 410. The first thickness 409 may be greater or less than the second thickness 410. The first thickness 409 will result in the first structures 114, 214 having the first depths 116, 216. The second thickness 410 will result in the second structures 115, 215 having the second depths 117, 217.

According to one embodiment, the device layer 408 includes, but is not limited to, one or more of titanium dioxide ($TiO_2$), zinc oxide (ZnO), tin dioxide ($SnO_2$), aluminum-doped zinc oxide (AZO), fluorine-doped tin oxide (FTO), cadmium stannate (tin oxide) (CTO), niobium oxide ($Nb_2O_5$), and zinc stannate (tin oxide) ($SnZnO_3$), silicon nitride ($Si_3N_4$), and amorphous silicon (a-Si) containing materials. In one embodiment, the height of the device layer 408 ranges from about 20 nm to about 200 nm. As shown in FIG. 3, the resist layer 407 is disposed on the device layer 408 at step 301. The device layer 408 includes a first portion 424 having first height 411 from the surface of the substrate and a second portion 425 having second height 412 from the surface of the substrate. The first height 411 corresponds to the first structures 114, 214 to be formed, and the second height 412 corresponds to the second structures 115, 215 to be formed.

The embodiment of FIG. 4A illustrates a 1:1 etch rate in which the resist layer 407 is etched at approximately the same rate as the device layer 408. The embodiment of FIG. 4D illustrates an etch rate other than 1:1. At step 301, as shown in FIG. 4A, a resist layer 407 is disposed over the device layer 408, the device layer 408 corresponding to the plurality of first structures 114, 214 and the plurality of second structures 115, 215 to be formed. In one embodiment, as shown in FIG. 4B, the resist layer 407 is disposed over the substrate 101.

Figure 4C:
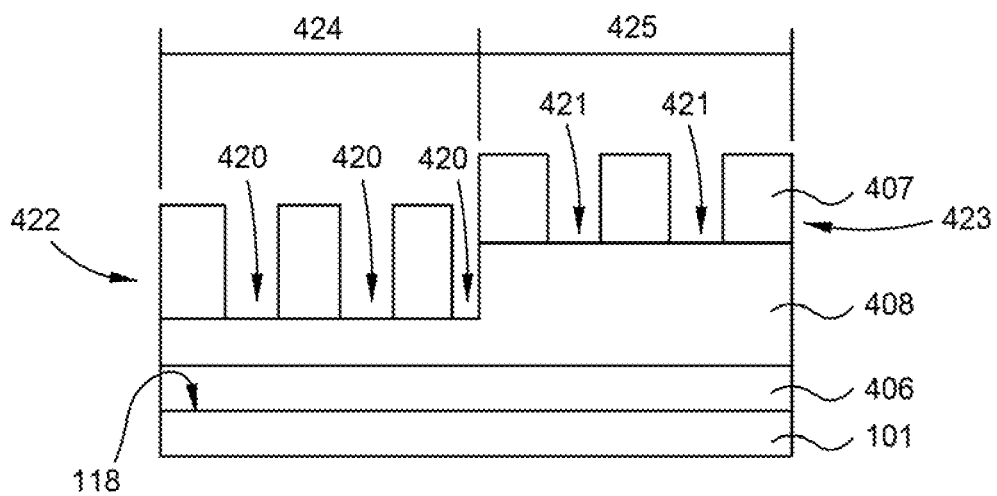
Figure 4D:
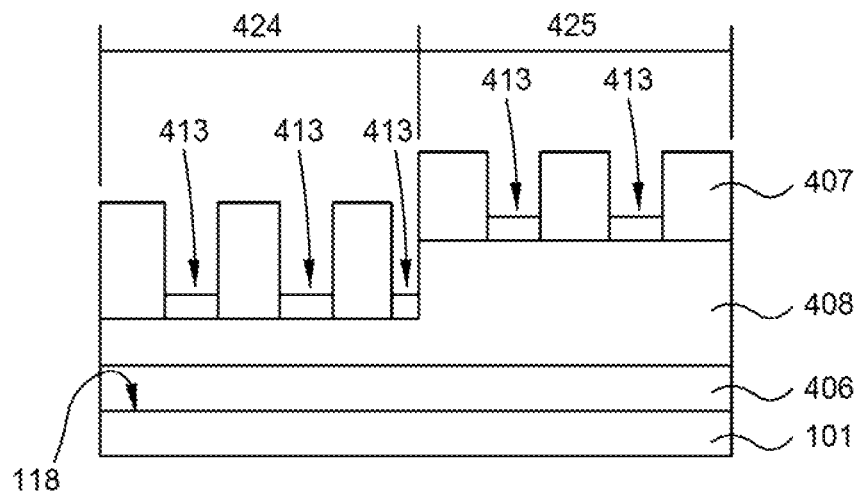

At step 302, the resist layer 407 is patterned to expose unmasked portions of the device layer 408 as depicted in FIGS. 4C and 4D. Patterning the resist layer 407 includes forming a first resist layer pattern 422 having a plurality of first openings 420 formed therein over the first portion 424 of the device layer 408, and forming a second resist layer pattern 423 having a plurality of second openings 421 formed therein over the second portion 425 of the device layer 408. The resist layer 407 may be patterned by processes including, but not limited to, nanoimprint lithography, photoimprint lithography, or any suitable process to expose unmasked portions of the device layer 408. In the embodiment depicted in FIG. 4D, a residual layer 413 remains after the resist layer 407 is patterned. In one embodiment, the residual layer 413 is removed through a dry etch process.

FIG. 4D illustrates an embodiment, in which an etch stop layer 406 is disposed on the substrate 101. The etch stop layer 406 prevents over-etching into the substrate 101. The etch stop layer 406 may be disposed by one or PVD, CVD, plasma-enhanced (PECVD), FCVD, ALD, and spin-on processes. The etch stop layer 406 is formed from any suitable material, provided that the etch stop layer 406 is resistant to the etching processes described herein. In one embodiment, the etch stop layer 406 includes a nitrogen-containing material. In one embodiment, the etch stop layer 406 is a non-transparent etch stop layer that is removed after the waveguide combiner is formed. In another embodiment, the etch stop layer 406 is a transparent etch stop layer. The etch stop layer 406 has a depth of about 5 nm to about 50 nm. Although an etch stop layer 406 is depicted herein, one or more embodiments without an etch stop layer 406 is contemplated.

At step 303 and as shown in FIGS. 4C and 4D, the exposed portions of the device layer 408 defined by the plurality of first openings 420 and the plurality of second openings 421 are etched to form the plurality of first structures 114, 214 and the plurality of second structures 115, 215. The plurality of first openings 420 in the first resist layer pattern 422 are configured to form at least a portion of the plurality of first structures 114, 214 within the optical device 100, 200. The plurality of second openings 421 in the second resist layer pattern 423 are configured to form at least a portion of the plurality of second structures 115, 215 within the optical device 100, 200. The etch process may include, but is not limited to, at least one of ion implantation, ion beam etching (IBE), reactive ion etching (RIE), directional RIE, plasma etching, and thermal atomic layer etching. In some embodiments, the etch process utilizes oxidizing etch chemistries. In other embodiments, the etch process utilizes reducing etch chemistries. In one embodiment, the etch process utilizes one or more oxygen, nitrogen gas ($N_2$), $SiO_2$, chlorine, and ammonia ($NH_3$) containing gases. In another embodiment, a fluorine containing gas, such as fluoromethane ($CH_3F$), sulfur hexafluoride ($SF_6$), tetrafluoromethane ($CF_4$), fluoroform ($CHF_3$), and nitrogen trifluoride ($NF_3$), is used as an etchant. The fluorine containing gas is optionally delivered to a processing environment with a methane containing gas, such as methane ($CH_4$) and dichlorodifluoromethane ($CCl_2F_2$).

Figure 4E:
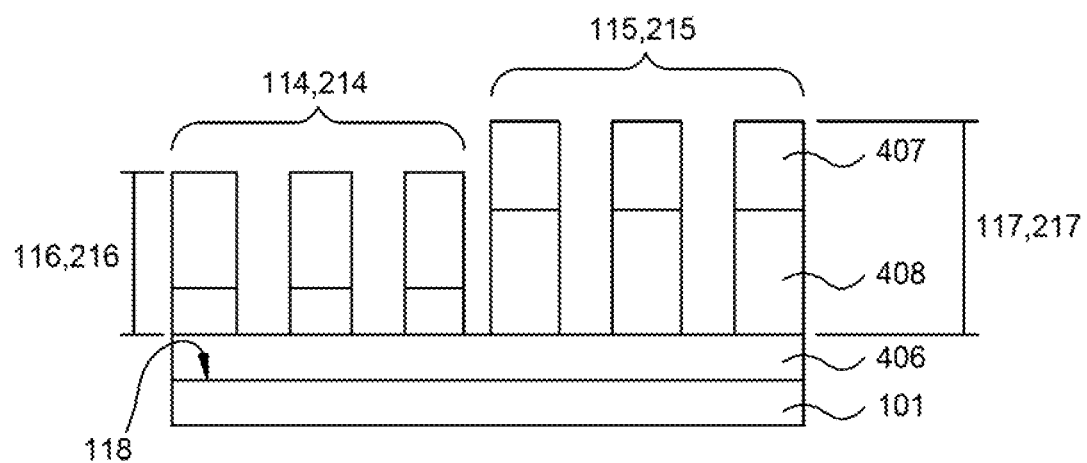

While FIG. 4E depicts first structures 114, 214 and second structures 115, 215 formed in the device layer 408, steps 301-303 are applicable to patterning the substrate 101. In one embodiment, as shown in FIGS. 3 and 4D, the device layer 408 is etched by the etch process to remove portions of the device layer 408 and form the first structures 114, 214 and the second structures 115, 215 in step 303. In another embodiment, the substrate 101 is etched by the etch process to remove portions of the substrate 101 and form the first structures 114, 214 and the second structures 115, 215 in step 303.

Figure 5:
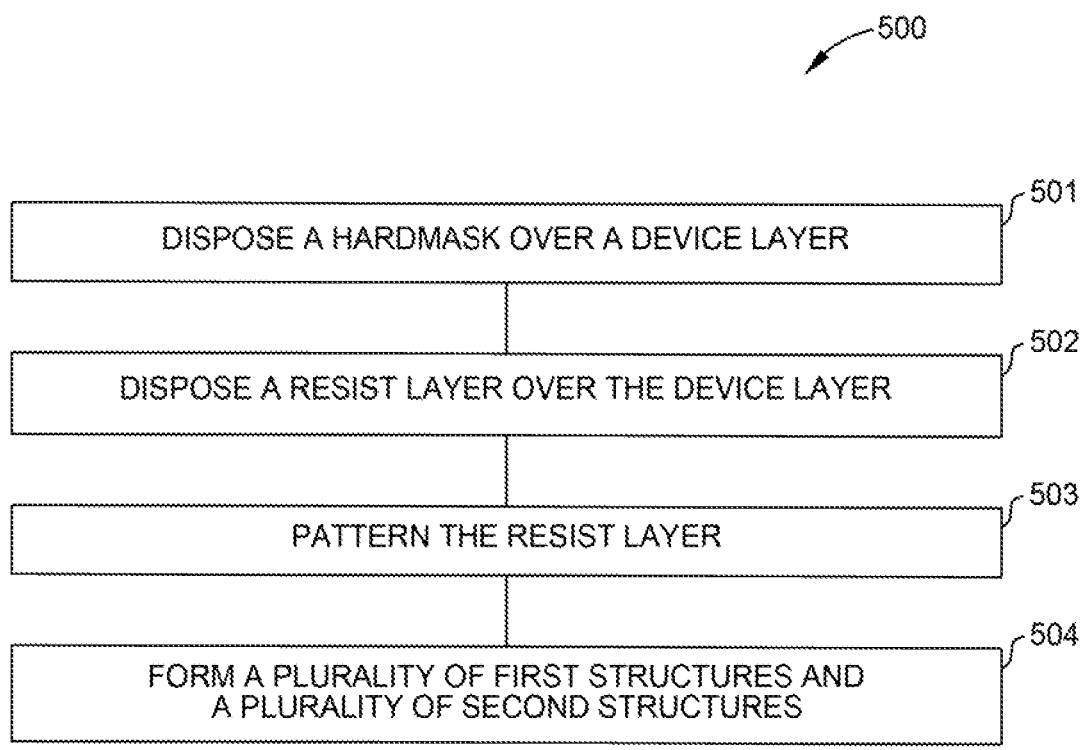
FIG. 5 is a flow diagram of a method for forming an optical device according to an embodiment.

FIG. 5 is a flow diagram of a method 500 for forming a portion of an optical device 100, 200 according to embodiments described herein. FIGS. 6A-6D are schematic, cross-sectional views of the optical device 100, 200 formed according to the method 500. The portion of the optical device 100, 200 may correspond to one grating, such as the first grating 102 or second grating 105, or the portion may correspond to the entirety of the optical device 100 or optical device 200.

Figure 6A:
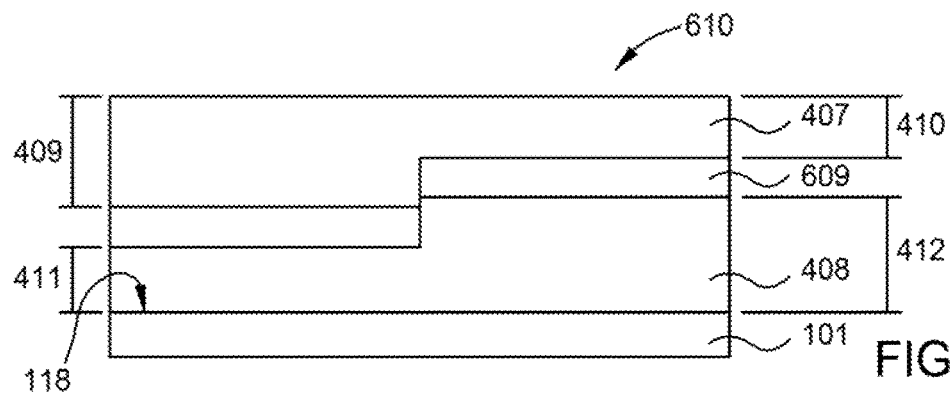
FIGS. 6A-6D are schematic, cross-sectional views of a substrate during a method of forming an optical device according to an embodiment.

At step 501, the hardmask 609 is disposed on the device layer 408 as shown in FIG. 6A. The hardmask 609 may be disposed over the device layer 408 by one or more liquid material pour casting, spin-on coating, liquid spray coating, dry powder coating, screen printing, doctor blading, PVD, CVD, PECVD, FCVD, ALD, evaporation, and sputtering processes. In one embodiment, the hardmask 609 is non-transparent and is removed after the optical device 100 or optical device 200 is formed. In another embodiment, the hardmask 609 is transparent. In some embodiments, the hardmask 609 includes any suitable imprint-resist material, for example chromium (Cr), silver (Ag), $Si_3N_4$, $SiO_2$, TiN, aluminum, and carbon containing materials.

At step 502, the resist layer 407 is disposed on the hardmask 609, and the device layer 408 corresponds to a plurality of first structures 114, 214 and a plurality of second structures 115, 215 to be formed. The device layer 408 has first height 411 and second height 412. In one embodiment, the first thickness 409 and the second thickness 410 of the resist layer 407 are different such that the top surface 610 of the resist layer 407 is parallel to the top surface 118 of the substrate 101. The top surface 610 of the resist layer 407 parallel to the top surface 118 of the substrate 101 provides a planarized surface to improve the uniformity of the patterning and/or etch process of steps 503 and 504.

Figure 6B:
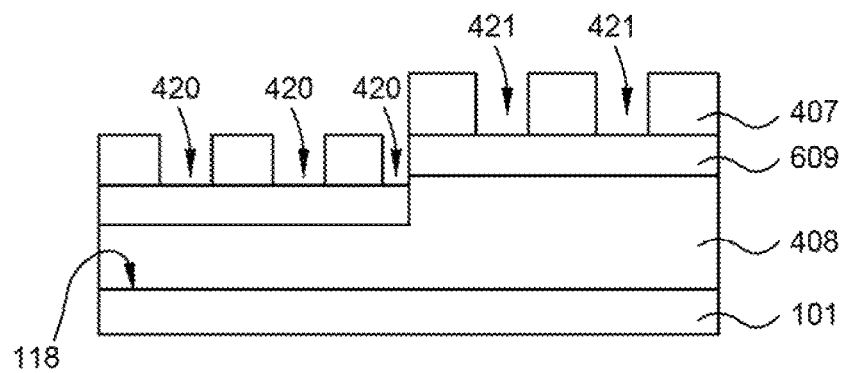
Figure 6C:
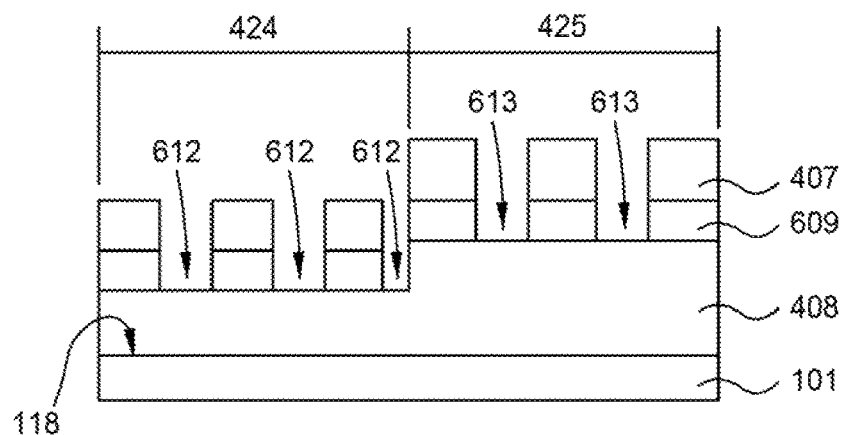
Figure 6D:
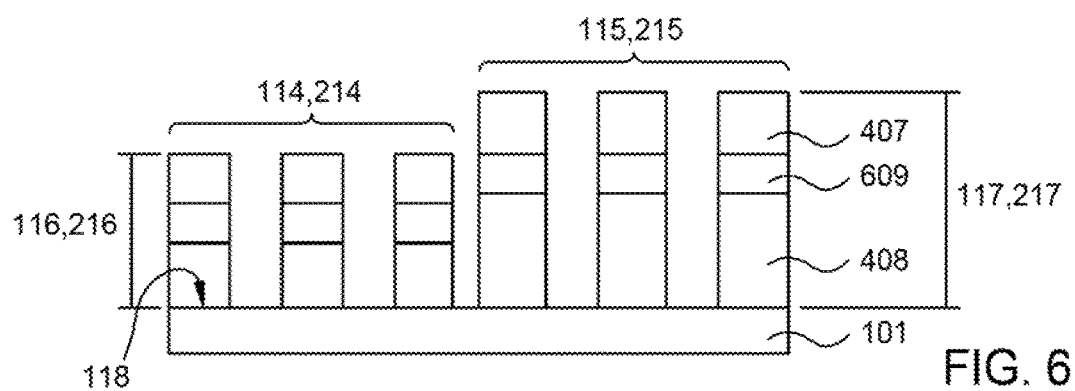

At step 503 and as shown in FIG. 6B, the resist layer 407 is patterned to expose portions of the hardmask 609. Patterning the resist layer 407 includes forming the first resist layer pattern 422 having the plurality of first openings 420 formed therein over the first portion 424 of the device layer 408, and forming the second resist layer pattern 423 having the plurality of second openings 421 formed therein over the second portion 425 of the device layer 408. At step 504 and as shown in FIG. 6C, the exposed portions of the hardmask 609 are etched to expose unmasked first device layer segments 612 of the first portion 424 of the device layer 408 and to expose unmasked second device layer segments 613 of the second portion 425 of the device layer 408. As shown in FIG. 6D, the first device layer segments 612 and the second device layer segments 613 of the device layer 408 are etched to form the plurality of first structures 114, 214 and the plurality of second structures 115, 215. The first device layer segments 612 are configured to form at least a portion of the plurality of first structures 114, 214 within the optical device 100, 200. The second device layer segments 613 are configured to form at least a portion of the plurality of second structures 115, 215 within the optical device 100, 200.

In one embodiment, the hardmask 609 is removed after the device layer 408 is etched. In another embodiment, the hardmask 609 remains on the device layer 408 after the device layer 408 is etched. While FIG. 6D depicts first structures 114, 214 and second structures 115, 215 formed in the device layer 408, steps 501-504 are applicable to patterning the substrate 101. In one embodiment, as shown in FIGS. 5 and 6D, the device layer 408 is etched by the etch process to remove portions of the device layer 408 and form the first structures 114, 214 and the second structures 115, 215 in step 504. In another embodiment, the substrate 101 is etched by the etch process to remove portions of the substrate 101 and form the first structures 114, 214 and the second structures 115, 215 in step 504.

Figure 7:
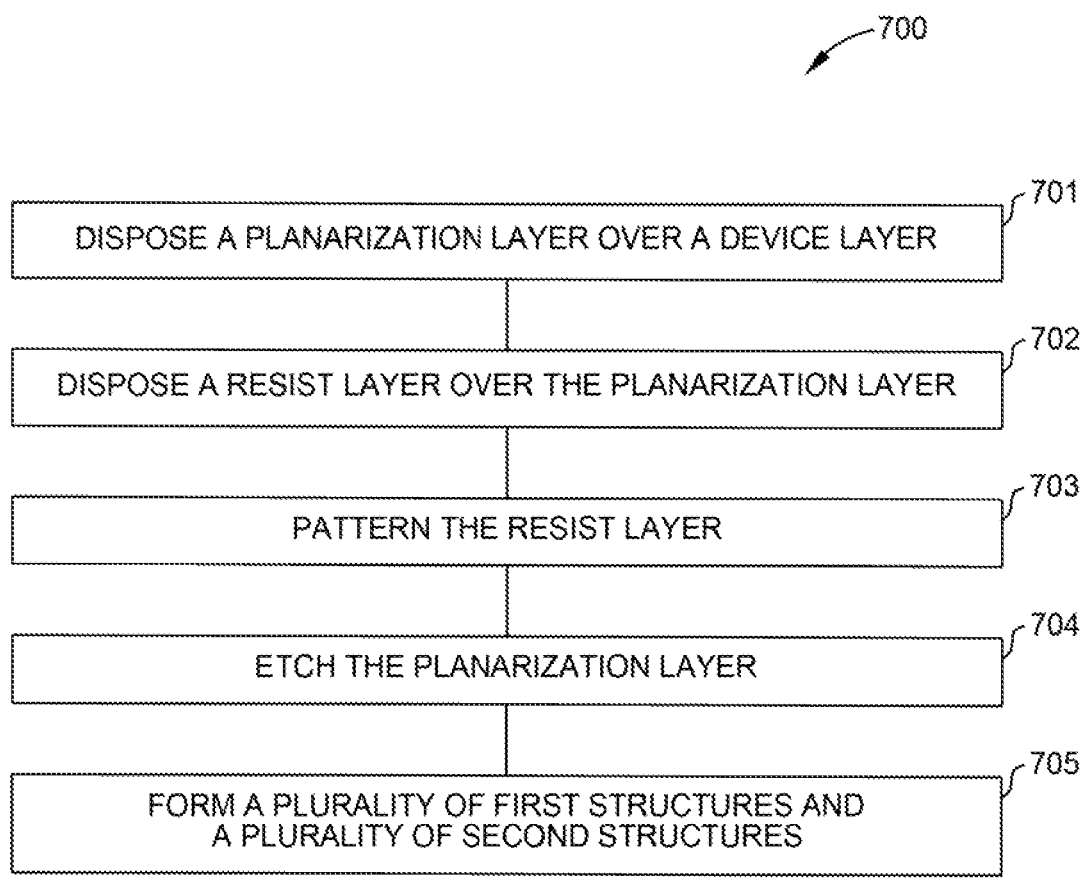
FIG. 7 is a flow diagram of a method for forming an optical device according to an embodiment.

FIG. 7 is a flow diagram of a method 700 for forming a portion of an optical device 100, 200 according to embodiments described herein. FIGS. 8A-8D are schematic, cross-sectional views of the optical device 100, 200 formed according to the method 700. The portion of the optical device 100, 200 may correspond to one grating, such as the first grating 102 or second grating 105, or the portion may correspond to the entirety of the optical device 100 or optical device 200.

Figure 8A:
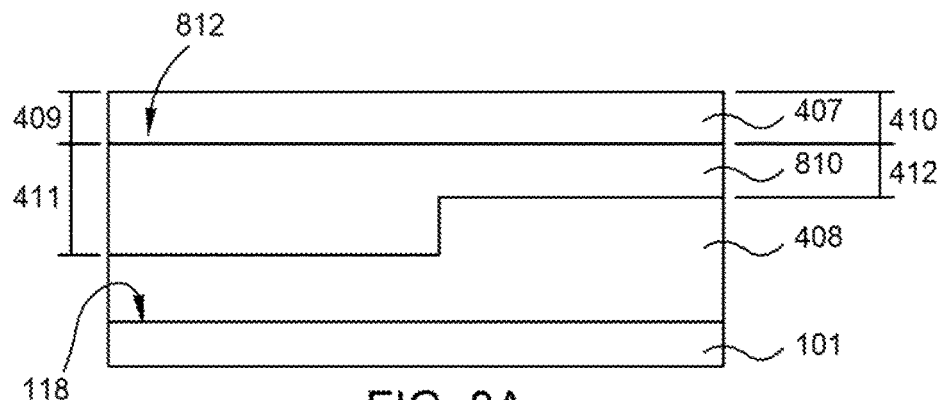
FIGS. 8A-8D are schematic, cross-sectional views of a substrate during a method of forming an optical device according to an embodiment.

At step 701, the planarization layer 810 is disposed over the device layer 408 as shown in FIG. 8A, the device layer 408 corresponding to a plurality of first structures 114, 214 and a plurality of second structures 115, 215 to be formed. In one embodiment, the planarization layer 810 includes a-Si containing materials. The planarization layer 810 may be deposited through any suitable process, including, but not limited to, a liquid material pour casting process, a spin-on coating process, a liquid spray coating process, a dry powder coating process, a screen printing process, a doctor blading process, a PVD process, a CVD process, a PECVD process, a FCVD process, or an ALD process. The planarization layer 810 forms a top surface 812 parallel to the substrate 101 so that the planarization layer 810 prevents over-etching of the device layer 408 in the etch process. At step 702, a resist layer 407 is disposed over the planarization layer 810.

Figure 8B:
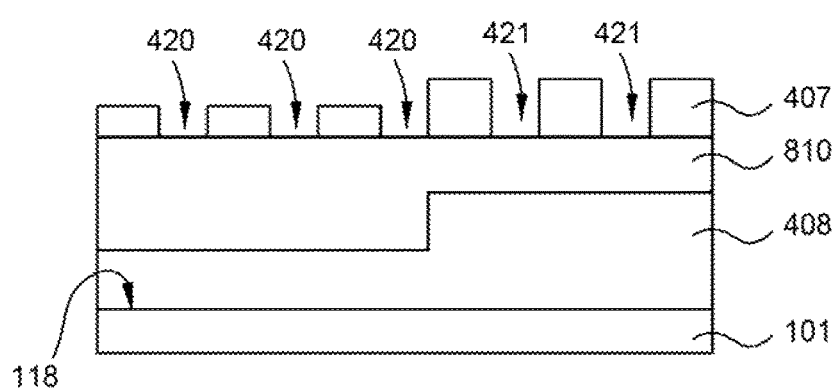
Figure 8C:
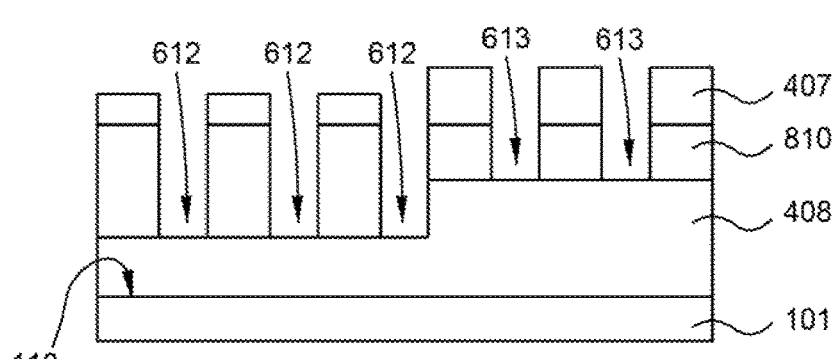

At step 703 and as shown in FIG. 8B, the resist layer 407 is patterned to expose portions of the planarization layer 810. Patterning the resist layer 407 includes forming the first resist layer pattern 422 having the plurality of first openings 420 formed therein over the first portion 424 of the device layer 408, and forming the second resist layer pattern 423 having the plurality of second openings 421 formed therein over the second portion 425 of the device layer 408. At step 704 and as shown in FIG. 8C, the exposed portions of the planarization layer 810 defined by the plurality of first openings 420 and the plurality of second openings 421 are etched to expose unmasked first device layer segments 612 of the first portion 424 of the device layer 408 and second device layer segments 613 of the second portion 425 of the device layer 408.

Figure 8D:
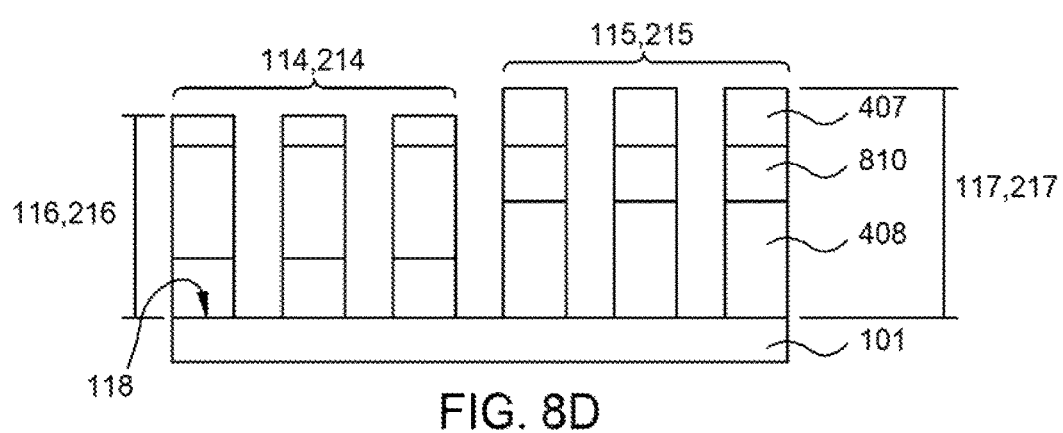

In step 705 and as shown in FIG. 8D, the first device layer segments 612 and the second device layer segments 613 of the device layer 408 are etched to form the plurality of first structures 114, 214 and the plurality of second structures 115, 215. The first device layer segments 612 are configured to form at least a portion of the plurality of first structures 114, 214 within the optical device 100, 200. The second device layer segments 613 are configured to form at least a portion of the plurality of second structures 115, 215 within the optical device 100, 200.

The etching includes, but is not limited to, one or more of ion implantation, ion etching, reactive ion etching (RIE), directional RIE, and plasma etching. In one embodiment, planarization layer 810 has a greater etch selectivity than the device layer 408. While FIG. 8D depicts first structures 114, 214 and second structures 115, 215 formed in the device layer 408, steps 701-705 are applicable to patterning the substrate 101. In one embodiment, the device layer 408 is etched by the etch process to remove portions of the device layer 408 and form the first structures 114, 214 and the second structures 115, 215 in step 705. In another embodiment, the substrate 101 is etched by the etch process to remove portions of the substrate 101 and form the first structures 114, 214 and the second structures 115, 215 in step 705.

The embodiments described herein provide methods for multi-depth optical devices while minimizing defects associated with over-etching and nonuniformity.

While the foregoing is directed to embodiments of the present disclosure, other and further embodiments of the disclosure may be devised without departing from the basic scope thereof, and the scope thereof is determined by the claims that follow.

What is claimed is:

1. A method of forming an optical device, comprising:
   disposing a hardmask over a device layer disposed directly over a planar top surface of a substrate, the device layer having:
      a first portion having a first height from the top surface of the substrate; and
      a second portion having a second height from the top surface of the substrate;
   disposing a resist layer over the hardmask, the resist layer having a top surface parallel to the top surface of the substrate;
   patterning the resist layer to:
      form a plurality of first openings therein over the first portion of the device layer to expose portions of the hardmask; and
      form a plurality of second openings over the second portion of the device layer to expose additional portions of the hardmask;
   etching the exposed portions of the hardmask to:
      expose a plurality of first device layer segments of the first portion of the device layer; and
      expose a plurality of second device layer segments within the second portion of the device layer; and
   etching the first device layer segments and the second device layer segments to expose at least a portion of the planar top surface of the substrate; and
      forming at least a portion of a plurality of first structures within the optical device, the first structures having a first depth relative to the top surface of the substrate; and
      forming at least a portion of a plurality of second structures within the optical device, the second structures having a second depth relative to the top surface of the substrate different than the first depth.

2. The method of claim 1, wherein the first depth is less than the second depth.

3. The method of claim 1, wherein the plurality of first structures and the plurality of second structures are perpendicular to the top surface of the substrate.

4. The method of claim 1, wherein the plurality of first structures and the plurality of second structures are at an angle, other than perpendicular, relative to the top surface of the substrate.

5. The method of claim 1, wherein the hardmask is non-transparent.

6. The method of claim 5, further comprising: removing the hardmask.

7. A method of forming an optical device, comprising:
   disposing a hardmask over a device layer disposed directly over a planar top surface of a substrate, the device layer having:
      a first portion having a first height from the planar top surface of the substrate; and
      a second portion having a second height from the planar top surface of the substrate; different from the first height
   disposing a resist layer over the hardmask;
   patterning the resist layer to:
      form a plurality of first openings over the first portion of the device layer to expose portions of the hardmask; and
      form a plurality of second openings over the second portion of the device layer to expose additional portions of the hardmask;
   etching the exposed portions of the hardmask to:
      expose a plurality of first device layer segments within the first portion of the device layer; and
      expose a plurality of second device layer segments within the second portion of the device layer; and
   etching the first device layer segments and the second device layer segments to expose at least a portion of the planar top surface of the substrate, wherein
      etching the first device layer segments comprises forming a plurality of first structures within the optical device, the first structures having a plurality of first openings there between, each of the first openings having a first depth; and
      etching the second device layer segments comprises forming a plurality of second structures within the optical device, the second structures having a plurality of second openings there between, each of the second openings having a second depth wherein the first depth is different than the second depth.

8. The method of claim 7, wherein the first depth is less than the second depth.

9. The method of claim 7, wherein a distance between the top surface and bottom surface of the first structures is different from a distance between the top surface and bottom surface of the second structures.

10. The method of claim 7, wherein the plurality of first structures and the plurality of second structures are perpendicular to the planar top surface of the substrate.

11. The method of claim 7, wherein the plurality of first structures and the plurality of second structures are at an angle, other than perpendicular, relative to the top surface of the substrate.

12. The method of claim 7, wherein the hardmask remains on the device layer during etching of the first device layer segments and the second device layer segments.

13. A method of forming an optical device, comprising:
   disposing a hardmask over a device layer disposed directly over a planar top surface of a substrate, the device layer having:
      a first portion having a first height from the planar top surface of the substrate; and
      a second portion having a second height from the planar top surface of the substrate;
   disposing a resist layer over the hardmask, the resist layer having a top surface parallel to the planar top surface of the substrate;

patterning the resist layer to:
   form a plurality of first openings over the first portion of the device layer to expose portions of the hardmask; and
   form a plurality of second openings over the second portion of the device layer to expose additional portions of the hardmask;
etching the exposed portions of the hardmask to:
   expose a plurality of first device layer segments within the first portion of the device layer; and
   expose a plurality of second device layer segments within the second portion of the device layer; and
etching the first device layer segments and the second device layer segments to expose at least a portion of the planar top surface of the substrate; and
   forming at least a portion of a plurality of first structures to expose a planar surface within the optical device, the first structures having a first depth relative to the top surface of the substrate, wherein the hardmask remains on the device layer; and
   forming at least a portion of a plurality of second structures to expose a planar surface within the optical device, the second structures having a second depth relative to the top surface of the substrate different than the first depth, wherein the hardmask remains on the device layer.

14. The method of claim 13, wherein the resist layer remains on the hardmask during etching of exposed portions of the hardmask.

15. The method of claim 13, wherein the plurality of first structures and the plurality of second structures are at an angle relative to the planar top surface of the substrate.

16. The method of claim 13, wherein the hardmask is non-transparent.

* * * * *